United States Patent
Osawa et al.

(10) Patent No.: US 12,368,049 B2
(45) Date of Patent: Jul. 22, 2025

(54) PROTECTIVE FILM AGENT AND PROCESSING METHOD OF WORKPIECE

(71) Applicant: DISCO CORPORATION, Tokyo (JP)

(72) Inventors: Sho Osawa, Tokyo (JP); Senichi Ryo, Tokyo (JP); Yukinobu Ohura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 286 days.

(21) Appl. No.: 17/929,786

(22) Filed: Sep. 6, 2022

(65) Prior Publication Data

US 2023/0091496 A1 Mar. 23, 2023

(30) Foreign Application Priority Data

Sep. 13, 2021 (JP) ................. 2021-148611

(51) Int. Cl.
| | |
|---|---|
| H01L 21/308 | (2006.01) |
| C09D 101/28 | (2006.01) |
| C09D 129/04 | (2006.01) |
| C09D 139/06 | (2006.01) |
| H01L 21/3065 | (2006.01) |
| H01L 21/311 | (2006.01) |
| H01L 21/56 | (2006.01) |
| C08K 5/1545 | (2006.01) |

(52) U.S. Cl.
CPC ...... *H01L 21/3081* (2013.01); *C09D 101/284* (2013.01); *C09D 129/04* (2013.01); *C09D 139/06* (2013.01); *H01L 21/3065* (2013.01); *H01L 21/31144* (2013.01); *H01L 21/56* (2013.01); *C08K 5/1545* (2013.01)

(58) Field of Classification Search
None
See application file for complete search history.

(56) References Cited

U.S. PATENT DOCUMENTS

| | | | | |
|---|---|---|---|---|
| 2004/0096780 | A1* | 5/2004 | Nozaki | H10B 41/40 |
| | | | | 257/E21.687 |
| 2016/0307851 | A1 | 10/2016 | Ohura et al. | |
| 2019/0371668 | A1 | 12/2019 | Karasaki et al. | |
| 2022/0119659 | A1* | 4/2022 | Landa | B41M 5/025 |

FOREIGN PATENT DOCUMENTS

| | | | |
|---|---|---|---|
| JP | 03198363 | A | 8/1991 |
| JP | 2004061668 | A | 2/2004 |
| JP | 2016207737 | A | 12/2016 |
| JP | 2021027254 | A | 2/2021 |
| JP | 2021061317 | A | 4/2021 |

OTHER PUBLICATIONS

Search report issued in counterpart Singapore patent application No. 10202250831W, dated Aug. 19, 2024.
Office Action issued in counterpart Japanese patent application No. 2021-148611, dated Apr. 9, 2024.

* cited by examiner

*Primary Examiner* — Jiong-Ping Lu
(74) *Attorney, Agent, or Firm* — GREER BURNS & CRAIN, LTD.

(57) ABSTRACT

There is provided a protective film agent with which a workpiece is coated when the workpiece is processed. The protective film agent includes a water-soluble resin, a light absorbing agent having a flavone structure, a flavonol structure, or an isoflavone structure, and a solvent that dissolves the resin and the light absorbing agent.

8 Claims, 12 Drawing Sheets

PROTECTIVE FILM AGENT AND PROCESSING METHOD OF WORKPIECE

BACKGROUND OF THE INVENTION

Field of the Invention

The present invention relates to a protective film agent with which a workpiece is coated and a processing method of a workpiece with use of the protective film agent.

Description of the Related Art

In pieces of electronic equipment typified by mobile phones and personal computers, device chips each including a device such as an electronic circuit are essential constituent elements. For example, the device chips are obtained by segmenting the front surface side of a wafer composed of a semiconductor such as silicon (Si) into multiple regions by planned processing lines referred to as streets, forming the device in each region, and thereafter dividing the wafer along the planned processing lines.

When the wafer is divided into small pieces such as the device chips, for example, a cutting apparatus in which an annular tool referred to as a cutting blade is mounted on a spindle is used. By rotating the cutting blade at high speed and causing the cutting blade to cut into the wafer along the planned processing line while a liquid such as pure water is supplied, cutting processing of the wafer can be executed, and the wafer can be divided into multiple small pieces (for example, refer to Japanese Patent Laid-open No. Hei 3-198363).

In recent years, a technique in which a wafer is divided by using plasma having high reactivity has also been proposed (for example, refer to Japanese Patent Laid-open No. 2016-207737). In this technique, the whole of the wafer can be processed at once by the plasma. Therefore, even when the total distance of the planned processing lines extends due to increase in the size of the wafer or size reduction of devices, extension of the time necessary for the dividing of the wafer is avoided. Further, a tool such as a cutting blade for mechanically processing the wafer is not used, and therefore, a problem such as chipping of the wafer attributed to contact with the tool also does not occur.

SUMMARY OF THE INVENTION

Incidentally, before the wafer is exposed to the plasma, masks having resistance against the plasma are formed on the wafer in order to protect devices and so forth made in the wafer from the plasma. Specifically, for example, a liquid protective film agent is applied to a front surface of the wafer to form a protective film, and thereafter, irradiation with a laser beam with such a wavelength as to be absorbed by the protective film is executed along the planned processing lines. As a result, parts that overlap with the planned processing lines in the protective film are removed, and the masks from which the planned processing lines are exposed can be formed.

However, when masks like the above-described ones are formed by using an existing protective film agent, the thickness of a peripheral part of the part irradiated with the laser beam (part at the edge of the mask) does not become uniform in many cases. Depending on the case, the part irradiated with the laser beam in the protective film is not properly removed. Further, when such masks with insufficient quality are used, it becomes difficult to keep the accuracy of the processing in the whole of the wafer.

Thus, an object of the present invention is to provide a protective film agent that can form a protective film suitable for processing performed by a laser beam and a processing method of a workpiece with use of the protective film agent.

In accordance with an aspect of the present invention, there is provided a protective film agent with which a workpiece is coated when the workpiece is processed. The protective film agent includes a water-soluble resin, a light absorbing agent having a flavone structure, a flavonol structure, or an isoflavone structure, and a solvent that dissolves the resin and the light absorbing agent.

Preferably, the light absorbing agent contains a transglycosylated compound, and the solvent contains water. Preferably, the transglycosylated compound is transglycosylated rutin or transglycosylated hesperidin. Preferably, the resin is polyvinyl alcohol, polyvinylpyrrolidone, hydroxypropyl cellulose, or polyoxazoline. Further, preferably, the protective film agent contains such an amount of the light absorbing agent that absorbance at a wavelength of 355 nm becomes equal to or higher than 5.0 in terms of a state in which the protective film agent is diluted 200-fold with water and when measurement is executed with a thickness of 1 cm.

In accordance with another aspect of the present invention, there is provided a processing method of a workpiece. The processing method includes a protective film forming step of forming a protective film by coating a front surface of the workpiece with the above-described protective film agent, a mask forming step of executing irradiation with a laser beam with such a wavelength as to be absorbed by the protective film along planned processing lines set in the front surface of the workpiece, to thereby remove parts that overlap with the planned processing lines in the protective film and form masks, and a plasma etching step of removing a part exposed from the masks in the workpiece by causing plasma to act on the part exposed from the masks in the workpiece.

In accordance with a further aspect of the present invention, there is provided a processing method of a workpiece. The processing method includes a protective film forming step of forming a protective film by coating a front surface of the workpiece with the above-described protective film agent and a laser ablation step of executing irradiation with a laser beam with such a wavelength as to be absorbed by the protective film and the workpiece along planned processing lines set in the front surface of the workpiece, to thereby remove parts that overlap with the planned processing lines in the protective film and parts that overlap with the planned processing lines in the workpiece.

The protective film agent according to the aspect of the present invention contains the light absorbing agent having a flavone structure, a flavonol structure, or an isoflavone structure. Therefore, compared with the existing protective film agent, for example, the absorbance at a wavelength in the ultraviolet region is easily enhanced. Thus, when the protective film is formed by using this protective film agent, it becomes possible to surely process the protective film by the laser beam having a wavelength in the ultraviolet region. As above, according to the aspect of the present invention, the protective film agent that can form the protective film suitable for processing by the laser beam is obtained.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
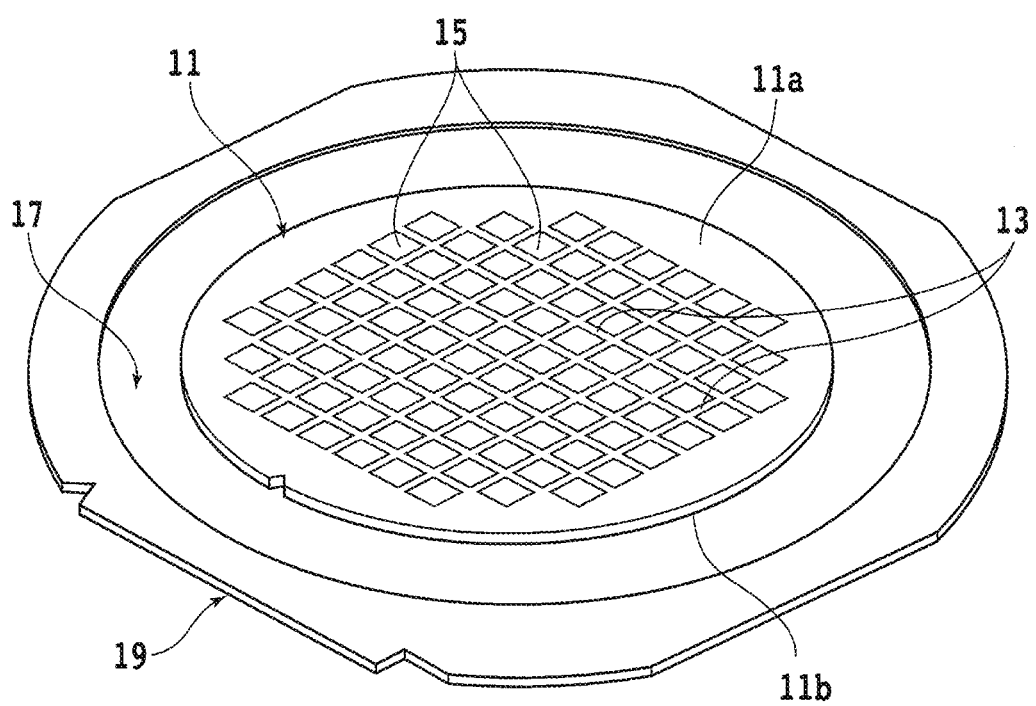
FIG. 1 is a perspective view illustrating an example of a workpiece to be coated with a protective film agent.

An embodiment of the present invention will be described below with reference to the accompanying drawings. A protective film agent according to the present embodiment is used to coat a workpiece when the workpiece is processed, for example. FIG. 1 is a perspective view illustrating an example of a workpiece 11 to be coated with the protective film agent according to the present embodiment.

As illustrated in FIG. 1, the workpiece 11 of the present embodiment is, for example, a wafer formed into a circular disc shape by using a semiconductor such as Si and has a circular front surface 11a and a circular back surface 11b on the opposite side of the front surface 11a. The side of the front surface 11a of the workpiece 11 is segmented into multiple small regions by multiple planned processing lines (streets) 13 that intersect each other, and a device 15 such as an integrated circuit (IC) is formed in each small region.

A tape (dicing tape) 17 with a size that allows covering of the whole of the back surface 11b is stuck to the side of the back surface 11b of the workpiece 11. Further, an annular frame 19 that surrounds the workpiece 11 is fixed to a peripheral part of the tape 17. As above, in the present embodiment, the workpiece 11 and the annular frame 19 are integrated through the tape 17. However, when the workpiece 11 is coated with the protective film agent, the tape 17 and the frame 19 do not necessarily need to be used.

The protective film agent of the present embodiment with which such a workpiece 11 is coated typically contains a water-soluble resin, a light absorbing agent that can absorb at least light with a wavelength in the ultraviolet region (preferably, 250 nm to 400 nm), and a solvent that dissolves the resin and the light absorbing agent.

The water-soluble resin is a polymer compound that allows dissolving of 0.5 g or more of the polymer compound with respect to 100 g of water whose temperature is 25° C. Cited as typical examples of such a polymer compound are polyvinylpyrrolidone, polyvinyl alcohol, hydroxypropyl cellulose, hydroxypropyl methylcellulose, polyethylene glycol, polyethylene oxide, methylcellulose, ethylcellulose, polyacrylic acid, poly-N-vinylacetamide, polyglycerin, polyoxazoline (for example, poly(2-methyl-2-oxazoline), poly(2-ethyl-2-oxazoline), poly(2-propyl-2-oxazoline), and so forth), poly-p-hydroxystyrene, polystyrene sulfonic acid, styrene-maleic acid, and (meta)acrylic resin.

As the water-soluble resin, any of these polymer compounds may be used alone, or multiple compounds in these polymer compounds may be used in any combination. That is, for the protective film agent, one kind of water-soluble resin may be used alone, or two or more kinds of water-soluble resins may be used in combination. Moreover, as the water-soluble resin, a copolymer of these polymer compounds (polyvinyl alcohol-acrylic acid-methyl methacrylate copolymer, vinyl acetate-vinyl pyrrolidone copolymer, ethylene-vinyl alcohol copolymer, polyvinyl alcohol-polyethylene glycol copolymer, or the like) is used in some cases. However, for the protective film agent, another polymer compound may be used as the water-soluble resin.

The light absorbing agent is a water-soluble compound having a flavone structure, a flavonol structure, or an isoflavone structure, for example. Such a compound favorably absorbs light with a wavelength in the ultraviolet region and is therefore suitable for a material (protective film agent) of a protective film to be processed into a predetermined pattern by using a laser beam with a wavelength of 355 nm (laser ablation processing), for example. The water-soluble compound refers to a compound that allows dissolving of 0.5 g or more of the compound with respect to 100 g of water whose temperature is 25° C., for example.

Specifically, the light absorbing agent according to the present embodiment has a flavone structure represented by the following chemical formula (1), for example. In chemical formula (1), R represents a hydrogen atom, a substituent, or a sugar chain.

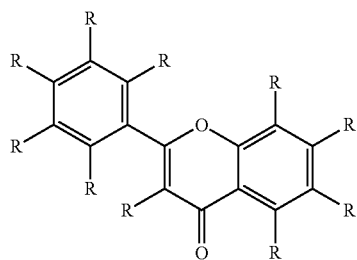

(1)

Alternatively, the light absorbing agent according to the present embodiment has a flavonol structure represented by the following chemical formula (2), for example. In chemical formula (2), R represents a hydrogen atom, a substituent, or a sugar chain.

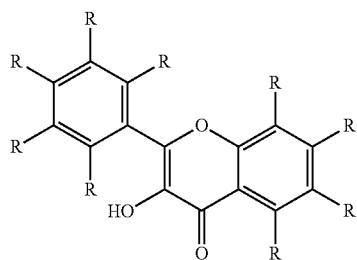

(2)

Alternatively, the light absorbing agent according to the present embodiment has an isoflavone structure represented by the following chemical formula (3), for example. In chemical formula (3), R represents a hydrogen atom, a substituent, or a sugar chain.

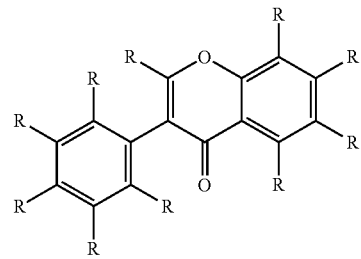

(3)

Cited as typical examples of such a compound are isorhamnetin, flavonol, 4'-hydroxyflavone, 5-hydroxyflavone, acacetin, wogonoside, 3-hydroxy-4'-methoxyflavone, 7,8-dihydroxyflavone, epimedin C, quercetin, baicalin, nobiletin, fisetin, rutin, icariin, icaritin, 7-hydroxyflavone, morin, kaempferide, hesperidin, 6-hydroxyflavone, kaempferol, wogonin, isoorientin, 5-methoxyflavone, luteolin, myricitrin, 3-methylflavone-8-carboxylic acid, 6-methylflavone, apigenin, 3-methoxyflavone, baicalein, 3,4'-dihydroxyflavone, orientin, 3',4'-dihydroxyflavone, methyl hesperidin, chrysin, 6-methoxyflavone, tangeretin, diosmetin, galangin, flavone, eupatilin, diosmin, neodiosmin, troxerutin, 2-(2-amino-3-methoxyphenyl)chromone, flavonol-2'-sulfonic acid, flavoxate, genistein, tectoridin, ononin, demethyltexasin, ipriflavone, neobavaisoflavone, sophoricoside, irisflorentin, puerarin, biochanin A, formononetin, tectorigenin, 7-methoxy-5-methylisoflavone, 4',6,7-trimethoxyisoflavone, daidzein, genistin, dihydrodaidzein, and daidzin. However, another light absorbing agent may be used for the protective film agent.

It is desirable that the above-described compound used as the light absorbing agent be a transglycosylated compound, in order to implement high water solubility of the light absorbing agent. Using a transglycosylated compound as the light absorbing agent makes it easier to enhance the concentration of the light absorbing agent in the protective film agent and implement high absorbance. Needless to say, another compound may be used as the light absorbing agent.

Here, the transglycosylated compound is a compound to which a sugar chain is linked, and is referred to also as glycoside. The sugar chain may be either a monosaccharide or an oligosaccharide (oligomer) as long as the sugar chain is in the state in which it can give water solubility to the above-described compound (substrate). Cited as typical examples of such a sugar chain are glucose, mannose, galactose, altrose, allose, talose, gulose, idose, xylose, arabinose, ribose, lyxose, apiose, erythrose, threose, fructose, psicose, sorbose, tagatose, ribulose, xylulose, erythrulose, sedoheptulose, coriose, glyceraldehyde, dihydroxyacetone, trehalose, isotrehalose, kojibiose, sophorose, nigerose, laminaribiose, maltose, cellobiose, isomaltose, gentiobiose, deoxyribose, fucose, rhamnose, glucosamin, galactosamine, glycerin, xylitol, sorbitol, glucuronic acid, galacturonic acid, ascorbic acid, glucuronolactone, gluconolactone, fructooligosaccharide, galactooligosaccharide, and lactosucrose. Further, the sugar chain may be a derivative or the like of these compounds.

A transglycosylated compound that is particularly preferable as the light absorbing agent of the present embodiment (that is, transglycosylated compound having a flavone structure, a flavonol structure, or an isoflavone structure) is, for example, transglycosylated rutin, transglycosylated hesperidin, or the like.

As this transglycosylated compound, there are compounds obtained by synthesis reaction besides natural compounds that naturally exist. As the synthesis reaction for obtaining the transglycosylated compound, for example, there are chemical synthesis using an artificial reaction reagent and enzyme synthesis using a natural transglycosylation enzyme (protein), and they are selected according to the purpose. The transglycosylation enzyme that implements transglycosylation is referred to as glycosyltransferase, and fucosyltransferase, galactosyltransferase, sialyltransferase, glucanotransferase, or the like is used depending on the kind of sugar.

For example, a compound obtained by additionally giving, by enzyme reaction, a sugar chain to natural rutin in which two rutinose groups are given to quercetin, which is one kind of flavonol, is also included in the above-described transglycosylated rutin. This is the same also regarding the transglycosylated hesperidin or another transglycosylated compound (transglycosylated compound having a flavone structure, a flavonol structure, or an isoflavone structure).

By giving a sugar chain having many hydroxyl groups to a compound (substrate) by the transglycosylation enzyme as above, the solubility of the compound in water can be enhanced. Further, by using a compound having high water solubility like the transglycosylated compound as the light absorbing agent, the concentration of the light absorbing agent in the protective film agent can be enhanced, and high absorbance can be implemented.

Similarly, it is desirable for the above-described compound used as the light absorbing agent to have a polar group (hydroxyl group, ether, amine, carboxy group, amide group, or the like) as a substituent, in order to allow implementation of higher water solubility. Using such a compound as the light absorbing agent can enhance the concentration of the light absorbing agent in the protective film agent and implement high absorbance. Needless to say, a compound having another substituent may be used as the light absorbing agent.

As the light absorbing agent, any of the above-described compounds may be used alone, or multiple compounds in these compounds may be used in any combination. That is, for the protective film agent, one kind of light absorbing agent may be used alone, or two or more kinds of light absorbing agents may be used in combination. Moreover, it is also possible to mix these light absorbing agents with a light absorbing agent such as a cinnamic acid derivative such as ferulic acid, caffeic acid, or chlorogenic acid or a benzophenone derivative such as polyhydroxybenzophenone or 2-hydroxy-4-methoxybenzophenone-5-sulfonic acid.

The solvent is water, for example. However, for the protective film agent, another solvent typified by an organic solvent that mixes with water may be used with water. As such an organic solvent, for example, propylene glycol monomethyl ether (PGME), methanol, ethanol, isopropanol, acetone, tetrahydrofuran, and so forth are cited. For the protective film agent, one kind of organic solvent may be used alone, or two or more kinds of organic solvents may be used in combination. Meanwhile, in the present embodiment, a compound having high water solubility is used as the light absorbing agent. Therefore, the concentration of the light absorbing agent in the protective film agent can be enhanced, and high absorbance can be implemented without using a lot of organic solvent as the solvent.

An antioxidant may be added to the protective film agent of the present embodiment for the purpose of suppressing deterioration thereof over time. As this antioxidant, L-ascorbic acid (i.e. vitamin C), D-araboascorbic acid, ethyl ascorbic acid, and L-ascorbic acid 2-glucoside are typically cited. To the protective film agent, any of them may be added alone, or multiple antioxidants of them may be added in any combination.

Further, a preservative may be added to the protective film agent of the present embodiment for the purpose of suppressing corrosion thereof. As this preservative, 4-hydroxybenzoic acid methyl is typically cited.

The content of the water-soluble resin, the light absorbing agent, and the solvent in the protective film agent is freely set in a range in which intended performance of the protective film agent is properly implemented. When the content of the water-soluble resin in the protective film agent is set higher, it becomes easier to make the thickness of a protective film formed by the protective film agent large. Further, in the case of the water-soluble resin having a similar structure, in general, it is easier to dissolve the water-soluble resin in the solvent when the molecular weight of the water-soluble resin becomes lower, and the viscosity is made low and the solution is easily sent in the case of implementing the same concentration.

In terms of the thickness of the protective film and the easiness of solution sending described above, it is desirable that the weight-average molecular weight of the water-soluble resin be equal to or lower than 250000, and it is more desirable that it be equal to or lower than 100000. The light absorbing agent can be made to be contained with any content, with the solubility thereof being the upper limit, in such a range as not to impair intended performance of the protective film agent. In the case of transglycosylated rutin (α-G-rutin) made by Toyo Sugar Refining Co., Ltd., 50 parts by mass of transglycosylated rutin was able to be dissolved in water.

Typically, when the whole of the protective film agent is deemed as 100 parts by mass, the content of the water-soluble resin is 5 to 35 parts by mass, and the content of the light absorbing agent is 1 to 25 parts by mass.

It is desirable that, in the protective film agent, such an amount of the light absorbing agent that the absorbance at a wavelength of 355 nm becomes equal to or higher than 5.0 per a thickness (length along the optical path) of 1 cm in terms of the state in which the protective film agent is diluted 200-fold with water be made to be contained. In other words, it is desirable that the protective film agent contain such an amount of the light absorbing agent that the absorbance at a wavelength of 355 nm becomes equal to or higher than 5.0 in terms of the state in which the protective film agent is diluted 200-fold with water and when measurement is executed with a thickness (length along the optical path) of 1 cm. This allows obtainment of the protective film agent that can form a protective film suitable for processing by a laser beam having a wavelength of 355 nm.

Further, it is desirable that the above-described protective film agent be further made to pass through an ion-exchange resin. This can remove impurities such as metal ions from the protective film agent. In association with this ion exchange, pH of the protective film agent becomes equal to or lower than 4. Although it is preferable that pH become equal to or lower than 4 in terms of preservation, preparation may be executed to cause pH of the protective film agent to become equal to or higher than 4 through addition of a base such as triethanolamine.

For example, the above-described protective film agent of the present embodiment is used for forming masks in plasma etching in which the workpiece 11 is exposed to plasma having high reactivity and is processed. In such a processing method of a workpiece, first, the front surface 11a of the workpiece 11 is coated with the protective film agent, and a protective film is formed (protective film forming step).

Figure 2:
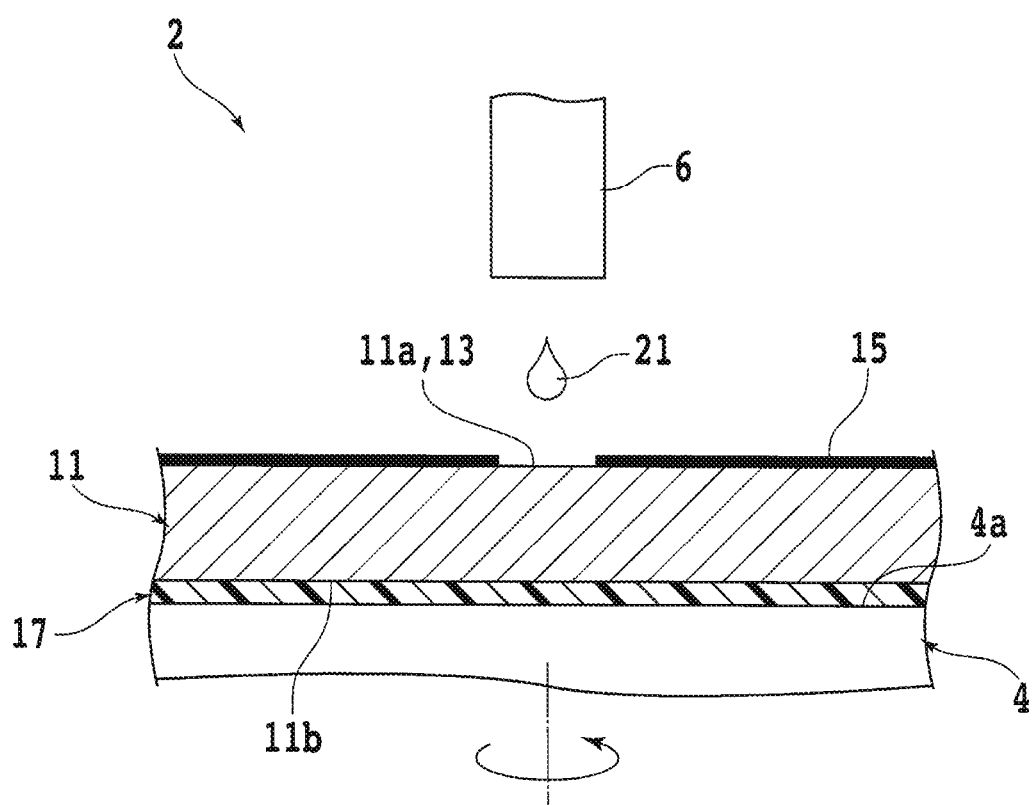
FIG. 2 is a sectional view illustrating how the workpiece is coated with the protective film agent.
Figure 3:
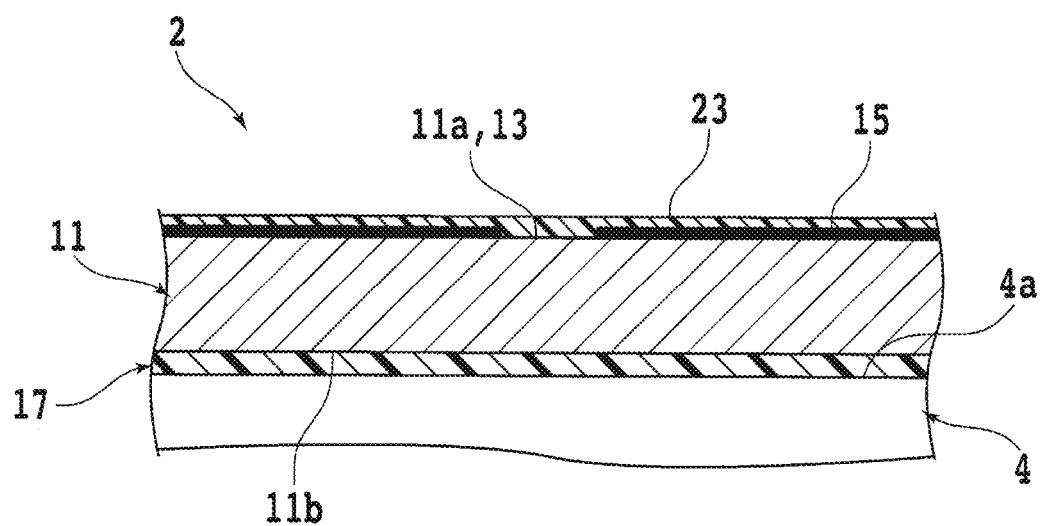
FIG. 3 is a sectional view illustrating the state in which a protective film has been formed on the workpiece.

FIG. 2 is a sectional view illustrating how the workpiece 11 is coated with a protective film agent 21. FIG. 3 is a sectional view illustrating the state in which a protective film 23 has been formed on the workpiece 11. In FIG. 2 and FIG. 3, side surfaces of some of elements are illustrated for convenience of explanation. When the workpiece 11 is coated with the protective film agent 21, for example, a spin coater 2 illustrated in FIG. 2 and FIG. 3 is used.

The spin coater 2 includes a spinner table (holding table) 4 for holding the workpiece 11. The spinner table 4 is coupled to a rotational drive source (not illustrated) such as a motor and rotates around a rotation axis substantially parallel to the vertical direction. Part of the upper surface of the spinner table 4 serves as a holding surface 4a for holding the workpiece 11.

The holding surface 4a is connected to a suction source (not illustrated) such as a vacuum pump through, for example, a flow path (not illustrated) formed inside the spinner table 4. A nozzle 6 for dropping the protective film agent 21, which is the material of the protective film 23, is disposed over the spinner table 4. Further, multiple clamps (not illustrated) for fixing the annular frame 19 are disposed around the spinner table 4.

When the workpiece 11 is coated with the protective film agent 21 and the protective film 23 is formed, first, the tape 17 stuck to the side of the back surface 11b of the workpiece 11 is brought into contact with the holding surface 4a of the spinner table 4, and a negative pressure of the suction source is caused to act thereon. In addition, the frame 19 is fixed by the clamps. The workpiece 11 is thereby held in the state in which the side of the front surface 11a is exposed upward.

Subsequently, as illustrated in FIG. 2, the protective film agent 21 is dropped from the nozzle 6, and the spinner table 4 is rotated, to apply the protective film agent 21 to the side of the front surface 11a of the workpiece 11. There is no particular limitation on the condition in the coating with the protective film agent 21. Typically, when the diameter of the workpiece 11 is 200 mm, the amount of dropped protective film agent 21 is 20 ml to 50 ml, the rotation speed (speed of rotation) of the spinner table 4 is 200 rpm to 3000 rpm, and the time for which the spinner table 4 is rotated is 30 seconds to 360 seconds.

Thereafter, by executing drying or the like of the protective film agent 21 applied to the side of the front surface 11a, the protective film 23 like that illustrated in FIG. 3 is completed. Methods for the drying include, besides natural drying, baking, irradiation with xenon pulses, irradiation with infrared, and so forth. Using a method such as baking, irradiation with xenon pulses, or irradiation with infrared can quickly dry the protective film agent 21 to form the protective film 23.

Although the workpiece 11 is coated with the protective film agent 21 by spin coating using the spin coater 2 in the present embodiment, the workpiece 11 may be coated with the protective film agent 21 by using another method such as spray coating. As the spray coating, there are spray with a binary fluid, spray by ultrasonic atomization, electrostatic spray, and so forth. Using the spin coating can easily form the uniform protective film 23 on the whole of the workpiece 11, and using the spray coating can form the favorable protective film 23 even in the case in which, for example, recesses and projections of the front surface 11a are large.

After the protective film 23 is formed on the front surface 11a of the workpiece 11, parts that overlap with the planned processing lines 13 in the protective film 23 are removed to form masks by executing irradiation with a laser beam with such a wavelength as to be absorbed by the protective film 23 along the planned processing lines 13 set in the front surface 11a of the workpiece 11 (mask forming step).

Figure 4:
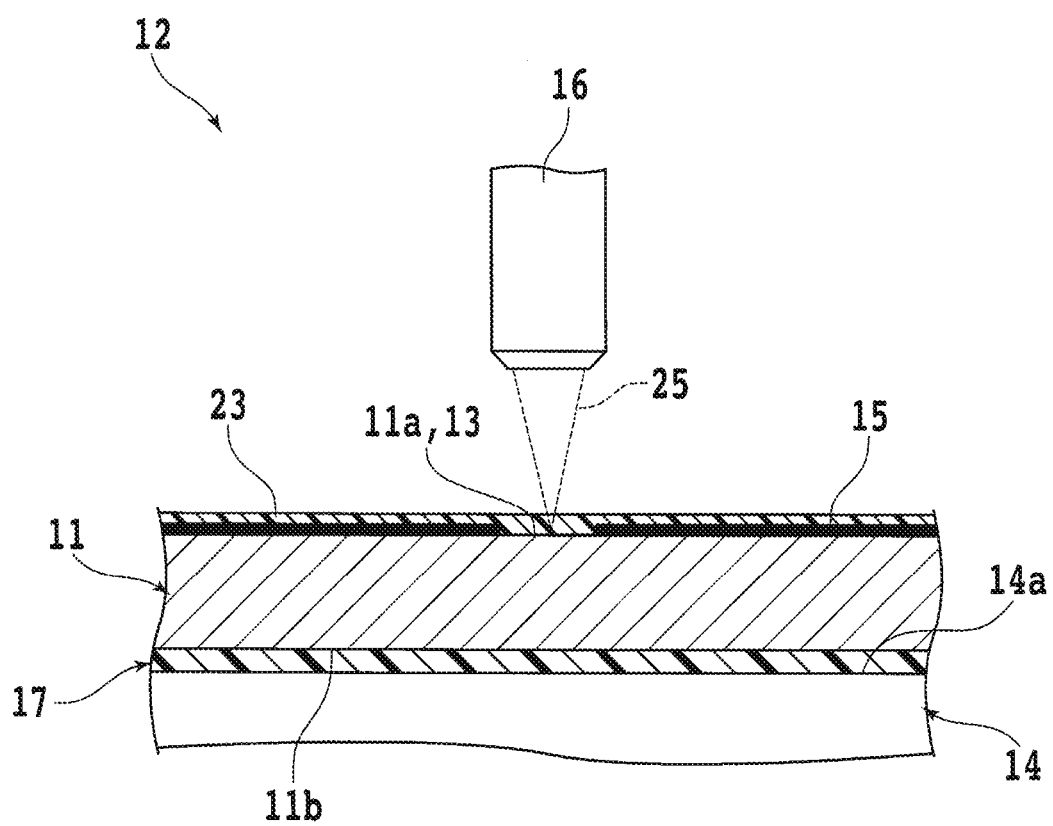
FIG. 4 is a sectional view illustrating how the protective film is irradiated with a laser beam.
Figure 5:
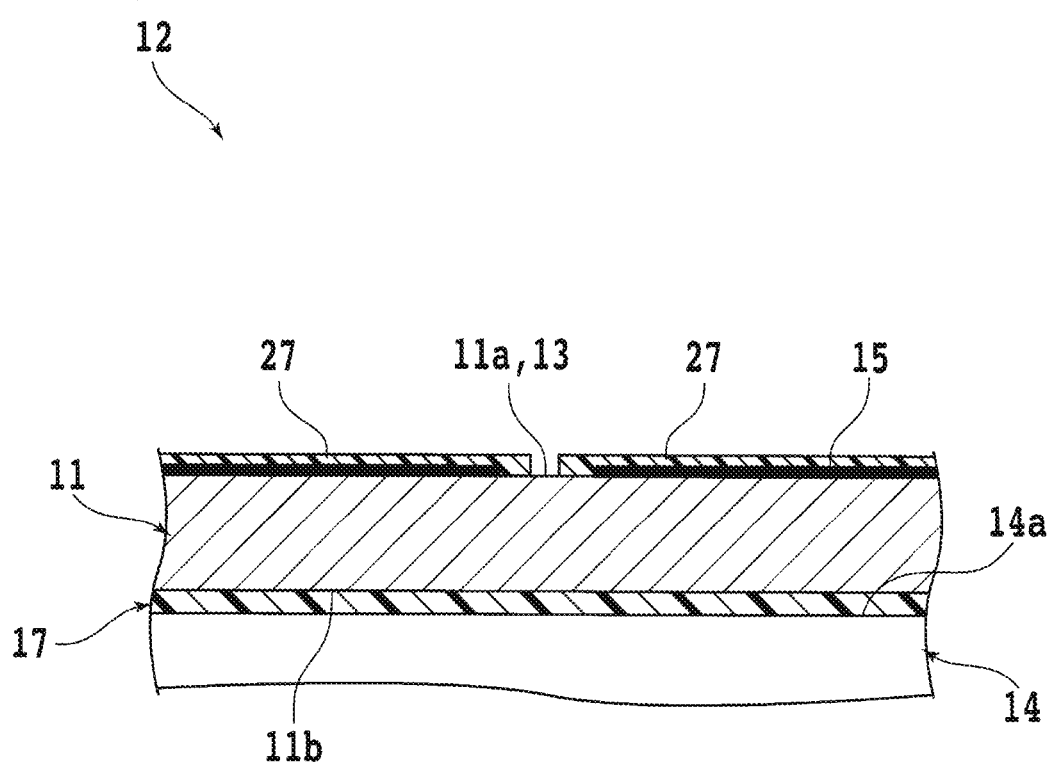
FIG. 5 is a sectional view illustrating the state in which masks have been formed on the workpiece.

FIG. 4 is a sectional view illustrating how the protective film 23 is irradiated with a laser beam 25. FIG. 5 is a sectional view illustrating the state in which masks 27 have been formed on the workpiece 11. In FIG. 4 and FIG. 5, side surfaces of some of elements are illustrated for convenience of explanation. When the protective film 23 is irradiated with the laser beam 25, for example, a laser processing apparatus 12 illustrated in FIG. 4 and FIG. 5 is used.

The laser processing apparatus 12 includes a chuck table (holding table) 14 for holding the workpiece 11. The chuck table 14 is coupled to a rotational drive source (not illustrated) such as a motor and rotates around a rotation axis substantially parallel to the vertical direction. Further, a table movement mechanism (not illustrated) is disposed under the chuck table 14, and the chuck table 14 moves in a processing feed direction (first horizontal direction) and an indexing feed direction (second horizontal direction) by this table movement mechanism.

Part of the upper surface of the chuck table 14 serves as a holding surface 14a for holding the workpiece 11. The holding surface 14a is connected to a suction source (not illustrated) such as a vacuum pump through, for example, a flow path (not illustrated) formed inside the chuck table 14. Multiple clamps (not illustrated) for fixing the annular frame 19 are disposed around the chuck table 14.

Moreover, a processing head 16 of a laser irradiation unit is disposed over the chuck table 14. The laser irradiation unit focuses the pulsed laser beam 25 generated by laser oscillation of a laser oscillator (not illustrated) on a predetermined position by the processing head 16.

The laser oscillator is configured to be capable of generating the laser beam 25 with such a wavelength as to be absorbed by the protective film 23 formed by using the protective film agent 21. The wavelength of the laser beam 25 generated by the laser oscillator is, for example, a wavelength in the ultraviolet region (preferably, 250 nm to 400 nm) and is typically 355 nm. However, there is no particular limitation on the wavelength of the laser beam 25 generated by the laser oscillator.

When the protective film 23 is irradiated with the laser beam 25 to form the masks 27, first, the tape 17 stuck to the side of the back surface 11b of the workpiece 11 is brought into contact with the holding surface 14a of the chuck table 14, and a negative pressure of the suction source is caused to act thereon. In addition, the frame 19 is fixed by the clamps. The workpiece 11 is thereby held in the state in which the protective film 23 that coats the side of the front surface 11a is exposed upward.

Next, the chuck table 14 is rotated, and the direction in which the planned processing line 13 of the target extends is caused to correspond with the processing feed direction of the laser processing apparatus 12. Further, the chuck table 14 is moved, and, for example, the position of the processing head 16 of the laser irradiation unit is adjusted to the upper side of an extension line of the planned processing line 13 of the target.

Then, as illustrated in FIG. 4, while the laser beam 25 is emitted from the processing head 16 of the laser irradiation unit toward the side of the front surface 11a of the workpiece 11, the chuck table 14 is moved in the processing feed direction. Here, for example, the laser beam 25 is focused on the surface or inside of the protective film 23.

The power of the laser beam 25 is set to, for example, 0.1 W to 100 W, typically 0.5 W. The spot diameter on the surface of the target (protective film 23) is adjusted to, for example, 1 µm to 100 µm, typically approximately 5 µm to 15 µm. The repetition frequency is set to, for example, 100 kHz to 50000 kHz, typically 100 kHz to 1000 kHz. The pulse width is set to, for example, 10 femtoseconds to 500 nanoseconds, typically 3 picoseconds to 30 picoseconds. The speed of the movement of the chuck table 14 is set to 20 mm/s to 5000 mm/s, typically 20 mm/s to 1000 mm/s. However, there is no particular limitation on the condition under which the irradiation with the laser beam 25 is executed. Further, in the present embodiment, the irradiation with the laser beam 25 is executed under the condition under which the workpiece 11 is hardly processed. However, the workpiece 11 may be partly processed by the laser beam 25.

As a result, the irradiation with the laser beam 25 can be executed along the planned processing line 13 of the target, and the part that overlaps with the planned processing line 13 in the protective film 23 can be removed. By repeating such operation and removing the parts that overlap with all planned processing lines 13 in the protective film 23, the masks 27 like those illustrated in FIG. 5 covering regions equivalent to the devices 15 of the workpiece 11 are obtained.

In the present embodiment, as described above, the protective film 23 is formed by using the protective film agent 21 containing the light absorbing agent suitable for implementation of high absorbance at a wavelength in the ultraviolet region. Thus, the protective film 23 can be caused to sufficiently absorb the laser beam 25, and the part as the target in the protective film 23 can be properly removed. Further, variations in the thickness of a peripheral part of the part irradiated with the laser beam 25 (part at the edge of the mask 27) also become small.

Figure 6:
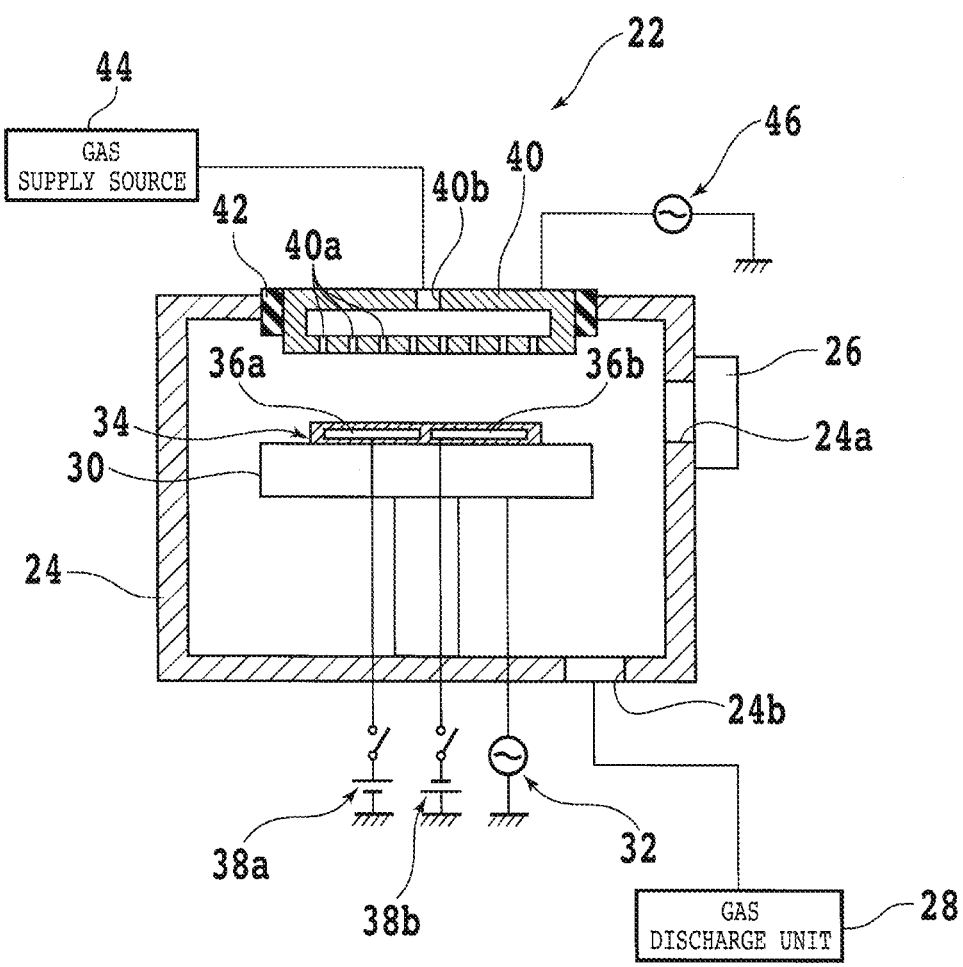
FIG. 6 is a sectional view illustrating an example of a plasma etching apparatus.
Figure 7:
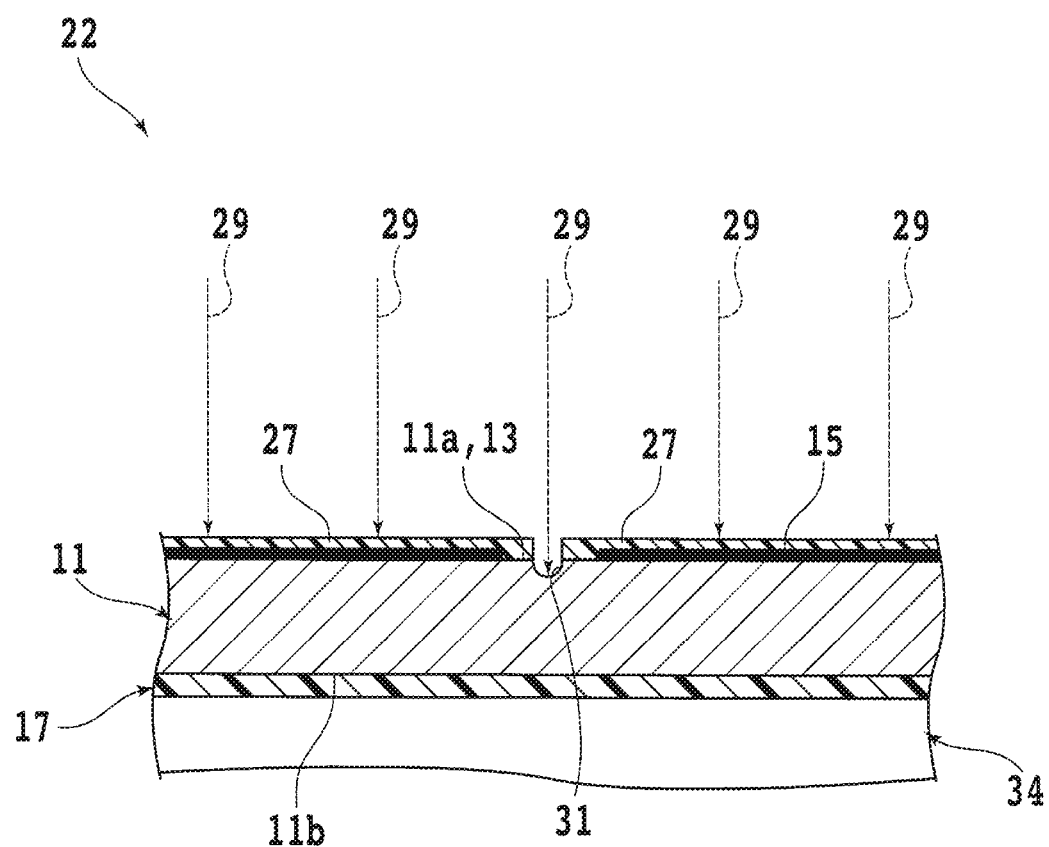
FIG. 7 is a sectional view illustrating how the workpiece is processed by plasma.

After the masks 27 that cover the workpiece 11 are formed, the part exposed from the masks 27 in the workpiece 11 is processed by causing plasma to act on the workpiece 11 with the interposition of the masks 27 (plasma etching step). FIG. 6 is a sectional view illustrating a plasma etching apparatus 22. FIG. 7 is a sectional view illustrating how the workpiece 11 is processed by plasma 29. In FIG. 6, for convenience of explanation, some of elements of the plasma etching apparatus 22 are represented by symbols and functional blocks. In FIG. 7, side surfaces of some of elements are illustrated.

When the workpiece 11 is processed by the plasma 29, for example, the plasma etching apparatus 22 illustrated in FIG. 6 is used. The plasma etching apparatus 22 includes a vacuum chamber 24 inside which a space for treatment is made. An opening 24a with such a size as to allow the workpiece 11 and the frame 19 to pass through the opening 24a is formed in a sidewall of the vacuum chamber 24. A cover 26 with such a size as to be capable of covering the opening 24a is disposed at the external of the opening 24a.

An opening-closing mechanism (not illustrated) is coupled to the cover 26, and the cover 26 is opened and closed by this opening-closing mechanism. By opening the cover 26 to expose the opening 24a, the workpiece 11 can be carried in to the space inside the vacuum chamber 24 through the opening 24a, or the workpiece 11 can be carried out from the space inside the vacuum chamber 24.

A gas discharge port 24b is formed in a bottom wall of the vacuum chamber 24. The gas discharge port 24b is connected to a gas discharge unit 28 such as a vacuum pump. A lower electrode 30 is disposed in the space of the vacuum chamber 24. The lower electrode 30 is formed into a circular disc shape with use of an electrically-conductive material and is connected to a high-frequency power supply 32 at the external of the vacuum chamber 24.

An electrostatic chuck 34 is disposed on the upper surface of the lower electrode 30. For example, the electrostatic chuck 34 includes an electrode 36a and an electrode 36b insulated from each other and holds the workpiece 11 by an electric force that acts between the electrode 36a and the electrode 36b and the workpiece 11. For example, the configuration is made in such a manner that a positive electrode of a direct-current power supply 38a can be connected to the electrode 36a and a negative electrode of a direct-current power supply 38b can be connected to the electrode 36b. The direct-current power supply 38a and the direct-current power supply 38b may be the same one direct-current power supply.

An upper electrode 40 formed into a circular disc shape with use of an electrically-conductive material is attached to a ceiling wall of the vacuum chamber 24 with the interposition of an insulating member 42. Multiple gas ejection holes 40a are formed on the lower surface side of the upper electrode 40, and the gas ejection holes 40a are connected to a gas supply source 44 through, for example, a gas supply hole 40b made on the upper surface side of the upper electrode 40. This can supply gas for plasma etching from the gas supply source 44 into the space of the vacuum chamber 24. The upper electrode 40 is also connected to a high-frequency power supply 46 at the external of the vacuum chamber 24.

When the workpiece 11 is processed by the plasma 29, first, the cover 26 is opened by the opening-closing mechanism. Next, the workpiece 11 is carried in to the space of the vacuum chamber 24 through the opening 24a and is placed on the electrostatic chuck 34. Specifically, the tape 17 stuck to the side of the back surface 11b of the workpiece 11 is brought into contact with the upper surface of the electrostatic chuck 34. Thereafter, when the electrostatic chuck 34 is actuated, the workpiece 11 is held in the state in which the masks 27 made on the side of the front surface 11a are exposed upward.

After the workpiece 11 is held by the electrostatic chuck 34, the workpiece 11 is processed along the planned processing lines 13 by causing the plasma 29 to act on the workpiece 11 with the interposition of the masks 27. Specifically, first, the cover 26 is closed by the opening-closing mechanism to seal the space of the vacuum chamber 24.

Further, the gas discharge unit 28 is actuated to reduce the pressure in the space of the vacuum chamber 24. In this state, while the gas for plasma etching is supplied from the gas supply source 44 at a predetermined flow rate, proper high-frequency power is supplied to the lower electrode 30 and the upper electrode 40 by the high-frequency power supply 32 and the high-frequency power supply 46. Thereupon, the plasma 29 including radicals, ions, and so forth is generated between the lower electrode 30 and the upper electrode 40 as illustrated in FIG. 7.

This can expose the side of the front surface 11a of the workpiece 11 that is not covered by the masks 27 (i.e. planned processing lines 13) to the plasma 29 and process the workpiece 11. The gas for plasma etching supplied from the gas supply source 44 is properly selected depending on the material of the workpiece 11 and so forth.

For example, in the case in which the workpiece 11 is desired to be deeply processed along the thickness direction like the case of dividing the workpiece 11 along the planned processing lines 13, it is preferable to repeat three steps of groove formation, film formation, and partial film removal. When a wafer formed by using silicon is employed as the workpiece 11, the process is as follows.

In the step of groove formation, for example, while the pressure in the space of the vacuum chamber 24 is kept constant, sulfur hexafluoride ($SF_6$) is supplied from the gas supply source 44 at a predetermined flow rate, and predetermined high-frequency power is supplied to the lower electrode 30 and the upper electrode 40. Thereby, for example, the plasma 29 of radicals, ions, and so forth whose material is $SF_6$ is generated, and the part that is not covered by the masks 27 on the side of the front surface 11a of the workpiece 11 can be processed. As a result, as illustrated in FIG. 7, a shallow groove 31 is formed in the planned processing line 13 of the workpiece 11.

In the step of film formation, for example, while the pressure in the space inside the vacuum chamber 24 is kept constant, octafluorocyclobutane ($C_4F_8$) is supplied from the gas supply source 44 at a predetermined flow rate, and predetermined high-frequency power is supplied to the lower electrode 30 and the upper electrode 40. As a result, a fluorine-based material can be deposited on the inside of the grooves 31 formed in the above-described step of groove formation, and thin films (not illustrated) that cover the inner surfaces of the grooves 31 can be formed. This film composed of the fluorine-based material has predetermined resistance against the plasma 29 generated with use of $SF_6$ as the material.

In the step of partial film removal, for example, while the pressure in the space inside the vacuum chamber 24 is kept constant, $SF_6$ is supplied from the gas supply source 44 at a predetermined flow rate, and predetermined high-frequency power is supplied to the lower electrode 30 and the upper electrode 40. In this step of partial film removal, the power supplied to the lower electrode 30 is set high compared with the step of groove formation.

When the power supplied to the lower electrode 30 is set higher, the anisotropy of the etching by the plasma 29 is enhanced. Specifically, parts on the side of the lower electrode 30 (i.e. bottom surface side of the groove 31) in the films that cover the grooves 31 are preferentially processed. That is, only the parts that cover the bottom surfaces of the grooves 31 in the films that cover the grooves 31 can be removed by the plasma 29 generated with use of $SF_6$ as the material.

Figure 8:
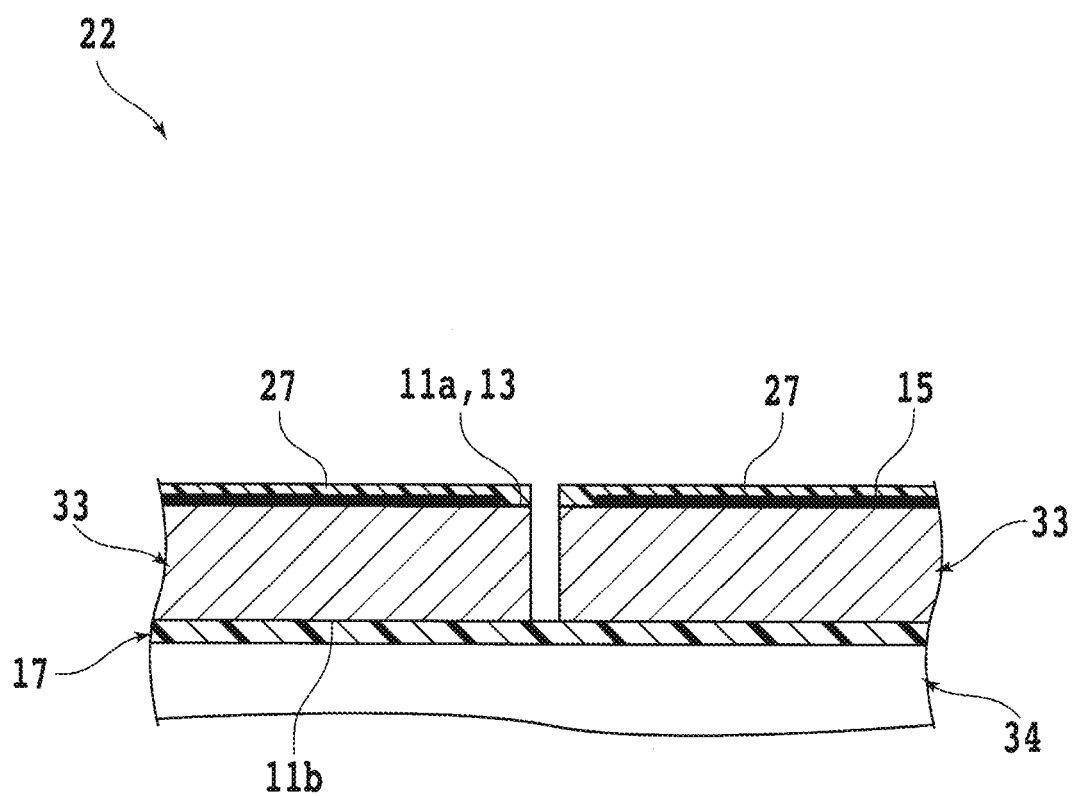
FIG. 8 is a sectional view illustrating the workpiece divided at planned processing lines.

By repeatedly executing the above-described three steps of groove formation, film formation, and partial film removal, the grooves 31 are gradually made deeper, and the workpiece 11 can be divided along the planned processing lines 13 at the end. FIG. 8 is a sectional view schematically illustrating the workpiece 11 divided at the planned processing lines 13. Also in FIG. 8, side surfaces of some of elements are illustrated for convenience of explanation. As illustrated in FIG. 8, multiple chips 33 are obtained when the workpiece 11 is divided at the planned processing lines 13.

It is preferable to remove the protective film 23 by such a method as two-fluid cleaning in which water and air are mixed and jetted, after the workpiece 11 is processed by the plasma 29. Using, for the protective film agent 21, the light absorbing agent having high water solubility as described above makes it possible to easily and surely remove the protective film 23 by such a method as two-fluid cleaning using water. That is, small amount of a residue attributed to the light absorbing agent readily remains compared with the case in which, for example, the light absorbing agent having high affinity for an organic solvent.

As methods in removal of the protective film 23, there are high-pressure cleaning, steam two-fluid cleaning, micro-nano bubble water cleaning, and so forth besides the two-fluid cleaning. Further, in these cleaning methods, water (cleaning water) at ordinary temperature may be used, or heated water may be used. Moreover, when it is difficult to remove the protective film by only water, the protective film may be removed from the workpiece by treatment by plasma, irradiation with ultraviolet (for example, wavelength of 185 nm and/or 254 nm), irradiation with excimer light (for example, wavelength of 172 nm), or cleaning using ozone water or the like.

As described above, the protective film agent 21 according to the present embodiment contains the light absorbing agent having a flavone structure, a flavonol structure, or an isoflavone structure. Therefore, compared with the existing protective film agent, for example, the absorbance at a wavelength in the ultraviolet region is easily enhanced. Thus, when the protective film 23 is formed by using the protective film agent 21, it becomes possible to surely process the protective film 23 by the laser beam 25 having a wavelength in the ultraviolet region.

Further, in the processing method of a workpiece according to the present embodiment, the protective film 23 is processed to form the masks 27 for plasma etching. Therefore, the planned processing lines 13 of the workpiece 11 are properly exposed from the masks 27. In addition, variations in the thickness of the part at the edge of the mask 27 also become small. Thus, the accuracy of processing by plasma etching can be kept high in the whole of the workpiece 11.

Next, an experiment performed in order to confirm effects of the above-described protective film agent and the result thereof will be described. First, multiple protective film agents (first to fifth working examples) different in the kind of water-soluble resin and the content of the light absorbing agent were prepared. In addition, an existing protective film agent (first comparative example) that did not contain the light absorbing agent of the present embodiment was prepared.

First Working Example 3 parts by mass of α-G-rutin (made by Toyo Sugar Refining Co., Ltd.) as the light absorbing agent was gradually added to 78 parts by mass of water (pure water) that served as the solvent, and stirring was performed until it was dissolved. Thereafter, 19 parts by mass of hydroxypropyl cellulose (hereinafter, referred to as HPC) was gradually added as the water-soluble resin, and stirring was performed until it was dissolved. As a result, the protective film agent of the first working example was obtained. The molecular weight of this HPC was 40000.

Second Working Example

In the procedure of fabricating the protective film agent of the first working example, α-G-rutin was changed to 6 parts by mass, and HPC was changed to 16 parts by mass, so that the protective film agent of the second working example was obtained through the same procedure.

Third Working Example

In the procedure of fabricating the protective film agent of the first working example, water was changed to 75 parts by mass, α-G-rutin was changed to 12.5 parts by mass, and HPC was changed to 12.5 parts by mass, so that the protective film agent of the third working example was obtained through the same procedure.

Fourth Working Example 6 parts by mass of α-G-rutin as the light absorbing agent was gradually added to 78 parts by mass of water that served as the solvent, and stirring was performed until it was dissolved. Thereafter, 16 parts by mass of polyvinyl alcohol (hereinafter, referred to as PVA) was gradually added as the water-soluble resin, and stirring was performed until it was dissolved. As a result, the protective film agent of the fourth working example was obtained. The degree of polymerization of this PVA was 300, and the degree of saponification was 78.5 mol % to 81.5 mol %.

Fifth Working Example 6 parts by mass of α-G-rutin as the light absorbing agent was gradually added to 78 parts by mass of water that served as the solvent, and stirring was performed until it was dissolved. Thereafter, 16 parts by mass of polyvinylpyrrolidone (hereinafter, referred to as PVP) was gradually added as the water-soluble resin, and stirring was performed until it was dissolved. As a result, the protective film agent of the fifth working example was obtained. The K value of this PVP was 48 to 52 (K-50).

First Comparative Example

A first solution was obtained by gradually adding 20.56 parts by mass of PVP to 64.35 parts by mass of water and performing stirring until it was dissolved. Further, a second solution was obtained by dissolving 0.3 parts by mass of ferulic acid as the light absorbing agent in 14.79 parts by mass of propylene glycol monomethyl ether (hereinafter, referred to as PGME). Thereafter, the first solution and the second solution were mixed, and 0.0012 parts by mass of ascorbic acid was further added. As a result, the protective film agent of the first comparative example was obtained.

The composition ratios (mass ratios) of the respective protective film agents (first to fifth working examples and first comparative example) is illustrated in Table 1 and Table 2. Descriptions in parentheses in Table 1 and Table 2 represent specific materials.

TABLE 1

|  | First working example | Second working example | Third working example |
|---|---|---|---|
| Water-soluble resin | 19 (HPC) | 16 (HPC) | 12.5 (HPC) |
| Light absorbing agent | 3 (α-G-rutin) | 6 (α-G-rutin) | 12.5 (α-G-rutin) |
| Water | 78 | 78 | 75 |
| Organic solvent | — | — | — |
| Others | — | — | — |
| Total | 100 | 100 | 100 |

TABLE 2

|  | Fourth working example | Fifth working example | First comparative example |
|---|---|---|---|
| Water-soluble resin | 16 (PVA) | 16 (PVP) | 20.56 (PVP) |
| Light absorbing agent | 6 (α-G-rutin) | 6 (α-G-rutin) | 0.3 (ferulic acid) |
| Water | 78 | 78 | 64.35 |
| Organic solvent | — | — | 14.79 (PGME) |
| Others | — | — | 0.0012 (ascorbic acid) |
| Total | 100 | 100 | 100 |

[Measurement of Absorbance]

After the above-described protective film agents were prepared, the absorbance at a wavelength of 355 nm per a thickness of 1 cm regarding each protective film agent was measured by using an ultraviolet-visible spectrophotometer (UV-2700 made by SHIMADZU CORPORATION). Specifically, the protective film agents of the respective working examples and the comparative example were diluted with water (pure water), and the obtained solutions were each enclosed in a prism-shaped cell made of quartz. Thereafter, the absorption spectrum of each protective film agent was measured in the state in which the protective film agent was enclosed in the cell. The thickness of the cell (length along the optical path) was 1 cm.

Due to the relation with the measurement limit of the spectrophotometer and so forth, regarding the protective film agents of the first working example and the first comparative example, the absorbance in the state in which the protective film agent was diluted 200-fold with water (pure water) was measured. Regarding the protective film agents of the second working example, the fourth working example, and the fifth working example, the absorbance in the state in which the protective film agent was diluted 400-fold with water was measured. Regarding the protective film agent of the third working example, the absorbance in the state in which the protective film agent was diluted 800-fold with water was measured.

The result of the above-described measurement of the absorbance is illustrated in Table 3. In Table 3, the absorbance of each protective film agent in terms of the state in which the protective film agent is diluted 200-fold with water is illustrated.

TABLE 3

|  | First working example | Second working example | Third working example | Fourth working example | Fifth working example | First comparative example |
|---|---|---|---|---|---|---|
| Absorbance | 3.192 | 6.452 | 13.20 | 6.420 | 6.430 | 0.166 |

[Formation of Protective Film]

By using the above-described protective film agents, protective films were formed on workpieces by spin coating. The rotation speed of a spinner table was set to 1000 rpm in the fourth working example and was set to 2000 rpm in the others, and the time of the rotation of the spinner table was set to 90 seconds. Further, the film thickness of each protective film obtained was measured by using a film thickness measuring instrument (F50 made by Filmetrics Japan, Inc.). The result of the measurement is illustrated in Table 4.

TABLE 4

| | First working example | Second working example | Third working example | Fourth working example | Fifth working example | First comparative example |
|---|---|---|---|---|---|---|
| Film thickness (μm) | 4.27 | 4.01 | 4.15 | 3.59 | 3.94 | 3.77 |

[Formation of Masks]

The protective films obtained by using the protective film agents were processed by a laser beam with a wavelength of 355 nm, and masks from which planned processing lines of the workpiece were exposed were formed. Here, the power of the laser beam was set to 0.5 W. The spot diameter on the surface of the protective film was adjusted to approximately 5 μm to 10 μm. The repetition frequency was set to 200 kHz. The pulse width was set to 9 picoseconds. The speed of movement of a chuck table was set to 600 mm/s.

Figure 9A:
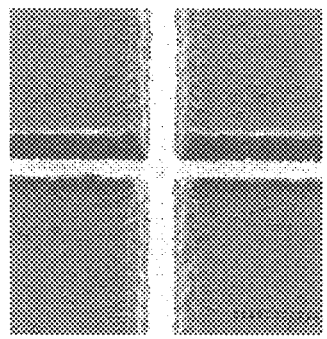
FIG. 9A is a photograph obtained by photographing, from the upper side, masks for which a protective film agent of a first working example was used.
Figure 9B:
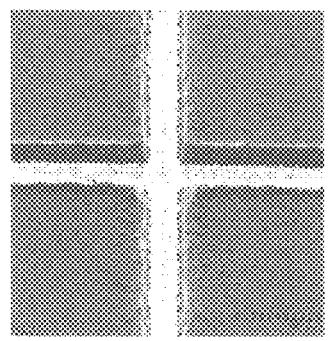
FIG. 9B is a photograph obtained by photographing, from the upper side, masks for which a protective film agent of a second working example was used.
Figure 9C:
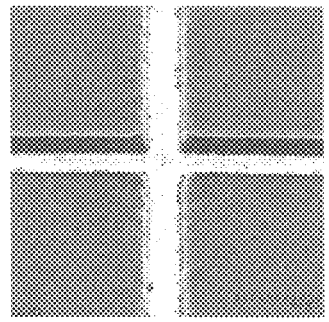
FIG. 9C is a photograph obtained by photographing, from the upper side, masks for which a protective film agent of a third working example was used.
Figure 9D:
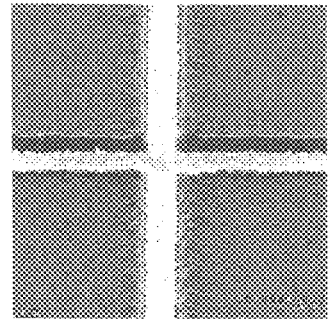
FIG. 9D is a photograph obtained by photographing, from the upper side, masks for which a protective film agent of a fourth working example was used.
Figure 9E:
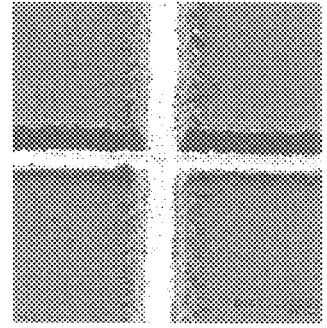
FIG. 9E is a photograph obtained by photographing, from the upper side, masks for which a protective film agent of a fifth working example was used.
Figure 9F:
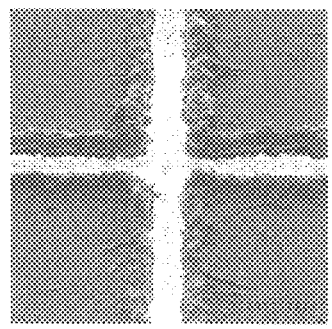
FIG. 9F is a photograph obtained by photographing, from the upper side, masks for which a protective film agent of a first comparative example was used.

Thereafter, each of the masks was photographed from the upper side. FIG. 9A is a photograph obtained by photographing, from the upper side, the masks for which the protective film agent of the first working example was used. FIG. 9B is a photograph obtained by photographing, from the upper side, the masks for which the protective film agent of the second working example was used. FIG. 9C is a photograph obtained by photographing, from the upper side, the masks for which the protective film agent of the third working example was used. FIG. 9D is a photograph obtained by photographing, from the upper side, the masks for which the protective film agent of the fourth working example was used. FIG. 9E is a photograph obtained by photographing, from the upper side, the masks for which the protective film agent of the fifth working example was used. FIG. 9F is a photograph obtained by photographing, from the upper side, the masks for which the protective film agent of the first comparative example was used.

As is understood from comparison between FIG. 9A, FIG. 9B, FIG. 9C, FIG. 9D, and FIG. 9E and FIG. 9F, in the masks for which the protective film agents of the first to fifth working examples were used (FIG. 9A, FIG. 9B, FIG. 9C, FIG. 9D, and FIG. 9E), rises of the part at the edge of the mask were small compared with the masks for which the protective film agent of the first comparative example was used (FIG. 9F). That is, variations in the thickness of the part at the edge of the mask were smaller.

Further, as is understood from comparison between FIG. 9A, FIG. 9B, and FIG. 9C, in the masks for which the protective film agents of the first to third working examples were used (FIG. 9A, FIG. 9B, and FIG. 9C), rises of the part at the edge of the mask became smaller as the content of the light absorbing agent increased. That is, variations in the thickness of the part at the edge of the mask became smaller as the content of the light absorbing agent increased.

[Processing of Workpiece]

The parts exposed from the masks in the workpieces were processed by plasma with use of the masks obtained in the above-described manner. Wafers formed with use of silicon were used as the workpieces. Further, when the workpiece was exposed to the plasma, the method in which the above-described three steps of groove formation, film formation, and partial film removal were repeated was applied.

Figure 10A:
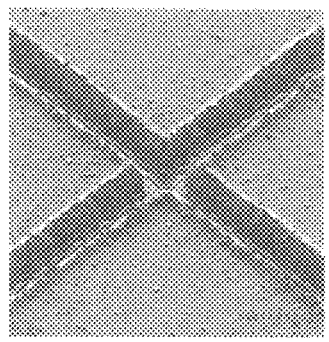
FIG. 10A is a photograph obtained by photographing, from the oblique upper side, a workpiece processed with use of the masks formed of the protective film agent of the first working example.
Figure 10B:
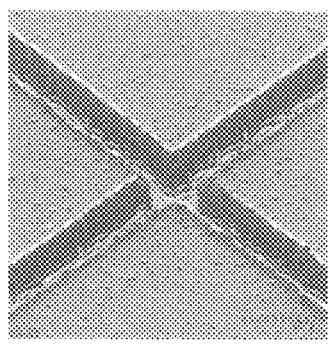
FIG. 10B is a photograph obtained by photographing, from the oblique upper side, a workpiece processed with use of the masks formed of the protective film agent of the second working example.
Figure 10C:
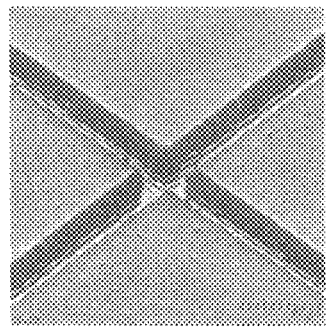
FIG. 10C is a photograph obtained by photographing, from the oblique upper side, a workpiece processed with use of the masks formed of the protective film agent of the third working example.
Figure 10D:
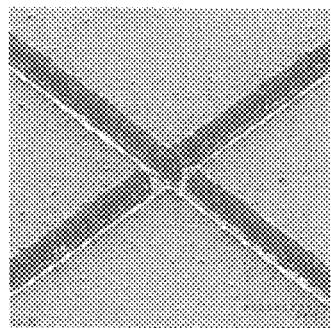
FIG. 10D is a photograph obtained by photographing, from the oblique upper side, a workpiece processed with use of the masks formed of the protective film agent of the fourth working example.
Figure 10E:
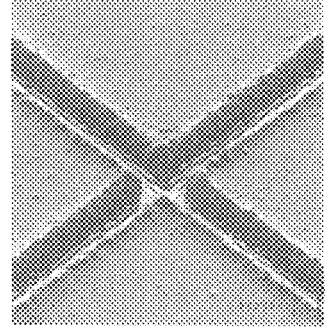
FIG. 10E is a photograph obtained by photographing, from the oblique upper side, a workpiece processed with use of the masks formed of the protective film agent of the fifth working example.
Figure 10F:
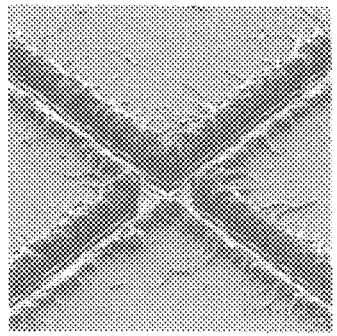
FIG. 10F is a photograph obtained by photographing, from the oblique upper side, a workpiece processed with use of the masks formed of the protective film agent of the first comparative example.

Thereafter, the processed workpieces were photographed from the oblique upper side in the state in which the masks remained on the front surface. FIG. 10A is a photograph obtained by photographing, from the oblique upper side, the workpiece processed with use of the masks formed of the protective film agent of the first working example. FIG. 10B is a photograph obtained by photographing, from the oblique upper side, the workpiece processed with use of the masks formed of the protective film agent of the second working example. FIG. 10C is a photograph obtained by photographing, from the oblique upper side, the workpiece processed with use of the masks formed of the protective film agent of the third working example. FIG. 10D is a photograph obtained by photographing, from the oblique upper side, the workpiece processed with use of the masks formed of the protective film agent of the fourth working example. FIG. 10E is a photograph obtained by photographing, from the oblique upper side, the workpiece processed with use of the masks formed of the protective film agent of the fifth working example. FIG. 10F is a photograph obtained by photographing, from the oblique upper side, the workpiece processed with use of the masks formed of the protective film agent of the first comparative example.

Figure 11A:
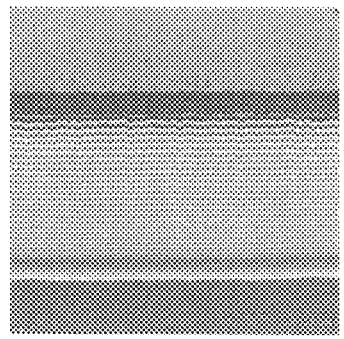
FIG. 11A is a photograph obtained by photographing, from the lateral side, the workpiece processed with use of the masks formed of the protective film agent of the first working example.
Figure 11B:
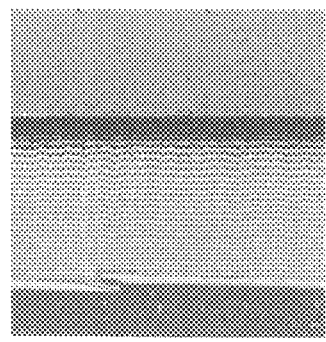
FIG. 11B is a photograph obtained by photographing, from the lateral side, the workpiece processed with use of the masks formed of the protective film agent of the second working example.
Figure 11C:
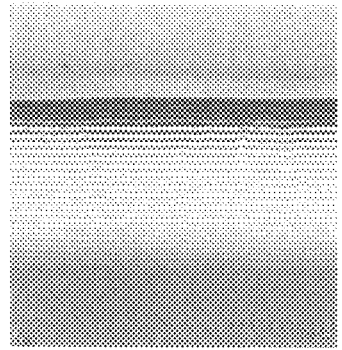
FIG. 11C is a photograph obtained by photographing, from the lateral side, the workpiece processed with use of the masks formed of the protective film agent of the third working example.
Figure 11D:
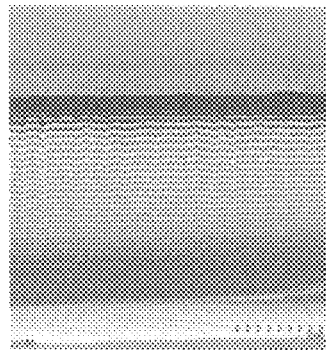
FIG. 11D is a photograph obtained by photographing, from the lateral side, the workpiece processed with use of the masks formed of the protective film agent of the fourth working example.
Figure 11E:
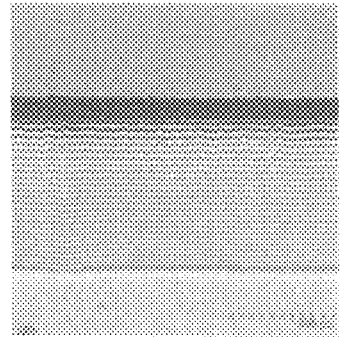
FIG. 11E is a photograph obtained by photographing, from the lateral side, the workpiece processed with use of the masks formed of the protective film agent of the fifth working example.
Figure 11F:
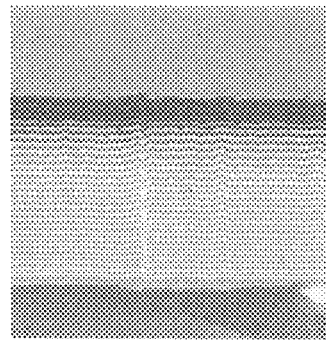
FIG. 11F is a photograph obtained by photographing, from the lateral side, the workpiece processed with use of the masks formed of the protective film agent of the first comparative example.

Further, the processed workpieces were photographed from the lateral side in the state in which the masks remained on the front surface. That is, side surfaces of the workpieces processed by the plasma were photographed. FIG. 11A is a photograph obtained by photographing, from the lateral side, the workpiece processed with use of the masks formed of the protective film agent of the first working example. FIG. 11B is a photograph obtained by photographing, from the lateral side, the workpiece processed with use of the masks formed of the protective film agent of the second working example. FIG. 11C is a photograph obtained by photographing, from the lateral side, the workpiece processed with use of the masks formed of the protective film agent of the third working example. FIG. 11D is a photograph obtained by photographing, from the lateral side, the workpiece processed with use of the masks formed of the protective film agent of the fourth working example. FIG. 11E is a photograph obtained by photographing, from the lateral side, the workpiece processed with use of the masks formed of the protective film agent of the fifth working example. FIG. 11F is a photograph obtained by photographing, from the lateral side, the workpiece processed with use of the masks formed of the protective film agent of the first comparative example.

As is understood from comparison between FIG. 10A, FIG. 10B, FIG. 10C, FIG. 10D, and FIG. 10E and FIG. 10F, in the masks formed of the protective film agent of the first comparative example (FIG. 10F), large rises remained at the part at the edge of the mask even after the workpiece was processed. That is, variations in the thickness of the part at the edge of the mask always continue to affect the accuracy of the processing of the workpiece during the treatment by the plasma.

Further, as is understood from comparison between FIG. 11A, FIG. 11B, FIG. 11C, FIG. 11D, and FIG. 11E and FIG. 11F, in the side surface of the workpiece processed with use of the masks formed of the protective film agent of the first comparative example (FIG. 11F), a linear defect (unevenness of processing) that extended in the thickness direction of the workpiece occurred due to variations in the thickness of the part at the edge of the mask. On the other hand, such a linear defect did not occur in the side surfaces of the workpieces processed with use of the masks formed of the protective film agents of the first to fifth working examples (FIG. 11A, FIG. 11B, FIG. 11C, FIG. 11D, and FIG. 11E).

As described above, it has been confirmed that using the protective film agent according to the present embodiment can form the protective film suitable for processing by the laser beam and keep the accuracy of the processing of the workpiece high.

Incidentally, it has been confirmed that, even with the existing protective film agent that does not use the light absorbing agent of the present embodiment, when the content of the organic solvent is increased, the absorbance at a wavelength of 355 nm can be enhanced to approximately 4.0 per a thickness of 1 cm in terms of the state in which the protective film agent is diluted 200-fold with water. For example, with a protective film agent of a second comparative example obtained in the following manner, the absorbance at a wavelength of 355 nm per a thickness of 1 cm was 4.048 in terms of the state in which the protective film agent was diluted 200-fold with water.

Second Comparative Example

A first solution was obtained by gradually adding 21 parts by mass of PVP to 57 parts by mass of water and performing stirring until it was dissolved. Further, a second solution was obtained by dissolving 2 parts by mass of 2,2',4,4'-tetrahydroxybenzophenone as the light absorbing agent in 20 parts by mass of PGME. Thereafter, the first solution and the second solution were mixed, and the protective film agent of the second comparative example was obtained.

Thus, in terms of implementation of high absorbance compared with the existing protective film agent, it is desirable to cause the protective film agent to contain such an amount of the light absorbing agent that the absorbance at a wavelength of 355 nm becomes equal to or higher than 5.0 per a thickness of 1 cm in terms of the state in which the protective film agent is diluted 200-fold with water. Further, it is more desirable to cause the protective film agent to contain such an amount of the light absorbing agent that the absorbance at a wavelength of 355 nm becomes equal to or higher than 10 per a thickness of 1 cm in terms of the state in which the protective film agent is diluted 200-fold with water.

However, when the content of the organic solvent is increased in order to increase the content of the light absorbing agent, a residue attributed to the light absorbing agent readily remains as described above. Further, when the content of the organic solvent is increased, such problems as lowering of the safety and deterioration of an adhesive layer of a dicing tape readily occur. In terms of solving these problems, it suffices that at least the light absorbing agent of the present embodiment is contained in the protective film agent. That is, there is no limitation on the lower limit and the upper limit of the content of the light absorbing agent that configures the protective film agent of the present embodiment.

The present invention is not limited to the description of the above-described embodiment and working examples and can be carried out with various changes. For example, in the processing method of a workpiece according to the above-described embodiment, the masks 27 for plasma etching are formed by using the protective film agent 21. However, the protective film agent 21 can be used also for a processing method of a workpiece using laser ablation, for example.

Also in the processing method of a workpiece according to this modification example, first, the front surface 11a of the workpiece 11 is coated with the protective film agent 21, and the protective film 23 is formed (protective film forming step). The specific procedure and so forth conducted when the protective film 23 is formed are similar to the procedure and so forth conducted when the protective film 23 is formed by the processing method of a workpiece according to the above-described embodiment.

After the protective film 23 is formed on the front surface 11a of the workpiece 11, parts that overlap with the planned processing lines 13 in the protective film 23 and parts that overlap with the planned processing lines 13 in the workpiece 11 are removed by executing irradiation with a laser beam with such a wavelength as to be absorbed by both the protective film 23 and the workpiece 11 along the planned processing lines 13 set in the front surface 11a of the workpiece 11 (laser ablation step).

Figure 12:
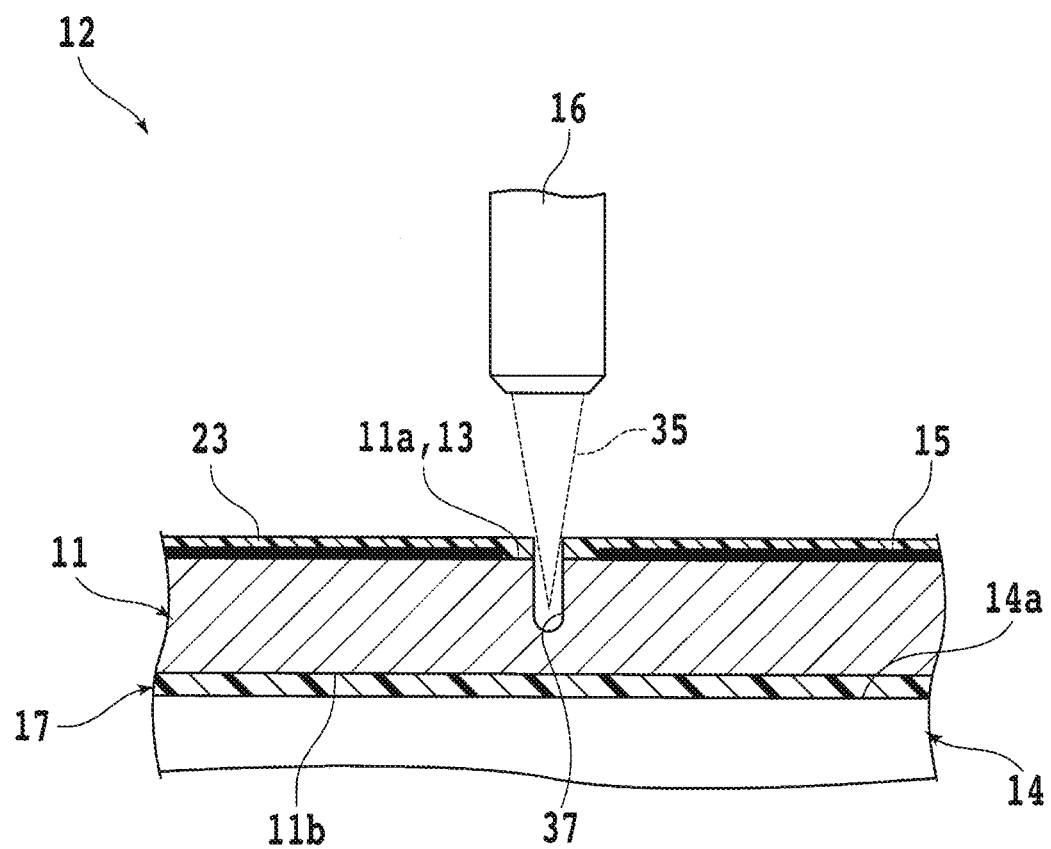
FIG. 12 is a sectional view illustrating how the workpiece is processed by a laser beam.

FIG. 12 is a sectional view illustrating how the workpiece 11 is processed by a laser beam 35. Also in FIG. 12, side surfaces of some of elements are illustrated for convenience of explanation. Also when the protective film 23 and the workpiece 11 are irradiated with the laser beam 35, the above-described laser processing apparatus 12 can be used.

However, in the present modification example, a laser oscillator (not illustrated) that can generate the laser beam 35 with such a wavelength in the ultraviolet region as to be absorbed by both the protective film 23 and the workpiece 11 is used. That is, the wavelength of the laser beam 35 generated by this laser oscillator is a wavelength in the ultraviolet region (preferably, 250 nm to 400 nm) and is typically 355 nm.

The procedure and so forth conducted when irradiation with the laser beam 35 is executed to process the protective film 23 and the workpiece 11 are also similar to the procedure and so forth conducted when the protective film 23 is irradiated with the laser beam 25 to form the masks 27. In the present modification example, it is preferable to focus the laser beam 35 on the front surface 11a or the inside of the workpiece 11.

The power of the laser beam 35 is set to, for example, 0.1 W to 100 W, typically 0.5 W to 15 W. The spot diameter on the surface of the target (for example, protective film 23) is adjusted to, for example, 1 μm to 100 μm, typically approximately 30 μm to 60 μm. The pulse width is set to, for example, 10 femtoseconds to 500 nanoseconds. The repetition frequency is set to, for example, 20 kHz to 50000 kHz, typically 20 kHz to 2000 kHz. The speed of the movement of the chuck table 14 is set to 20 mm/s to 5000 mm/s, typically 100 mm/s to 1000 mm/s. In the present modification example, irradiation with the laser beam 35 needs to be executed with a condition under which both the protective film 23 and the workpiece 11 are processed. This can remove the parts that overlap with the planned processing lines 13 in the protective film 23 and the parts that overlap with the planned processing lines 13 in the workpiece 11.

Besides, structures, methods, and so forth according to the above-described embodiment and modification example can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective film agent with which a workpiece is coated when the workpiece is processed, the protective film agent comprising:
a water-soluble resin;
a light absorbing agent; and
a solvent that dissolves the resin and the light absorbing agent, and
wherein the light absorbing agent contains a transglycosylated compound, and the solvent contains water, and further wherein the transglycosylated compound is transglycosylated rutin.

2. The protective film agent according to claim 1, wherein the resin is polyvinyl alcohol, polyvinylpyrrolidone, hydroxypropyl cellulose, or polyoxazoline.

3. The protective film agent according to claim 1, wherein the protective film agent contains such an amount of the light absorbing agent that absorbance at a wavelength of 355 nm becomes equal to or higher than 5.0 in terms of a state in which the protective film agent is diluted 200-fold with water and when measurement is executed with a thickness of 1 cm.

4. The protective film agent according to claim 1, wherein the weight-average molecular weight of the water-soluble resin is equal to or lower than 250000.

5. A protective film agent with which a workpiece is coated when the workpiece is processed, the protective film agent comprising:
a water-soluble resin;
a light absorbing agent; and
a solvent that dissolves the resin and the light absorbing agent, and
wherein the light absorbing agent contains a transglycosylated compound, and the solvent contains water, and
further wherein the transglycosylated compound is transglycosylated rutin or transglycosylated hesperidin.

6. The protective film agent according to claim 5, wherein the resin is polyvinyl alcohol, polyvinylpyrrolidone, hydroxypropyl cellulose, or polyoxazoline.

7. The protective film agent according to claim 5, wherein the protective film agent contains such an amount of the light absorbing agent that absorbance at a wavelength of 355 nm becomes equal to or higher than 5.0 in terms of a state in which the protective film agent is diluted 200-fold with water and when measurement is executed with a thickness of 1 cm.

8. The protective film agent according to claim 5, wherein the weight-average molecular weight of the water-soluble resin is equal to or lower than 250000.

\* \* \* \* \*